United States Patent [19]
Tiefert

[11] 3,961,350
[45] June 1, 1976

[54] METHOD AND CHIP CONFIGURATION OF HIGH TEMPERATURE PRESSURE CONTACT PACKAGING OF SCHOTTKY BARRIER DIODES

[75] Inventor: Karl H. Tiefert, Sunnyvale, Calif.

[73] Assignee: Hewlett-Packard Company, Palo Alto, Calif.

[22] Filed: Nov. 4, 1974

[21] Appl. No.: 520,328

[52] U.S. Cl. .................... 357/15; 357/54; 357/55; 357/68; 357/71; 357/79
[51] Int. Cl.² ............... H01L 29/48; H01L 29/34; H01L 23/48; H01L 23/42
[58] Field of Search ............. 357/15, 54, 68, 55, 357/71, 79

[56] References Cited
UNITED STATES PATENTS

| | | | |
|---|---|---|---|
| 3,513,367 | 5/1970 | Wolley | 357/68 |
| 3,689,392 | 9/1972 | Sandera | 357/54 |
| 3,745,428 | 7/1973 | Misawa et al. | 357/54 |

*Primary Examiner*—Edward J. Wojciechowicz
*Attorney, Agent, or Firm*—F. D. LaRiviere

[57] ABSTRACT

The configuration of the Schottky barrier diode chip described herein is capable of withstanding temperatures on the order of 700°C and pressures commonly developed by a DO-35 semi-conductor package when sealing such chips therein. The chip configurations described herein effectively divert the pressure applied to the chip by the package from the immediate junction area of the diode while at the same time assuring reliable electrical contact without damage to the chip or degradation of electrical characteristics thereof.

7 Claims, 6 Drawing Figures

METHOD AND CHIP CONFIGURATION OF HIGH TEMPERATURE PRESSURE CONTACT PACKAGING OF SCHOTTKY BARRIER DIODES

BACKGROUND & SUMMARY OF THE INVENTION

The electrical characteristics of certain semiconductor devices such as Schottky barrier diodes are significantly degraded as a function of pressure applied to the junction area. Such devices therefore require extensive multi-piece packaging schemes to avoid damage to the chip or degradation of the electrical characteristics thereof. Such a packaging method is shown, for example, in U.S. Pat. No. 3,178,796.

The DO-35 package is a reliable, hermetic, glass-to-metal seal, semiconductor package consisting of two identical stud-leads 10 (hereinafter referred to as studs and typically of Dument or other suitable lead material) and a glass sleeve 12 as shown in FIG. 1. While its assembly is simple, fast and efficient, the package does rely on pressure contact of the studs directly to the semiconductor chip for electrical connection of, for example, the anode and cathode of a diode to the package leads. After assembly, the entire assembled unit including chip 11 is heated to a temperature of approximately 700°C to obtain the hermetic glass-to-metal seal. As the package cools, additional pressure is applied to the chip as a result of the contraction of the glass as it cools to room temperature. Schottky barrier diodes of conventional design (contact button on top of the junction area) show degraded characteristics after this sealing process.

The effects of high temperature on the metallization and chemical integrity of the diode chip must also be considered. For a Schottky barrier diode, the metallization must achieve the desired barrier height and exhibit good adhesion to Si, $SiO_2$ and $Si_3N_4$. In addition, undesirable chemical reactions between package impurities and the diode chip during the sealing process must be prevented.

There are several chip configurations which overcome the difficulties discussed above. One configuration incorporates a relatively thick glass layer which covers the entire chip surface except that area immediately surrounding the junction. The metallization is then deposited over the diode junction area and extends over the top of the glass layer. The additional pressure developed by the package glass sleeve as it contracts during cooling from the sealing temperature is thus transferred via anode stud and glass layer to the chip area remote from the sensitive junction area.

In another configuration, the metallization scheme includes several contact pads remote from the junction area which the anode stud contacts. Thin metal fingers provide electrical connection between the metallization covering the diode and the contact pads. Again, the increased contact pressure received from the studs as the glass package contracts is transferred to the chip via the contact pads at some distance remote from the diode junction.

DESCRIPTION OF THE DRAWINGS

FIG. 4b is a top view of the embodiment of FIG. 4a.

DESCRIPTION OF THE PREFERRED EMBODIMENT

Figure 2:
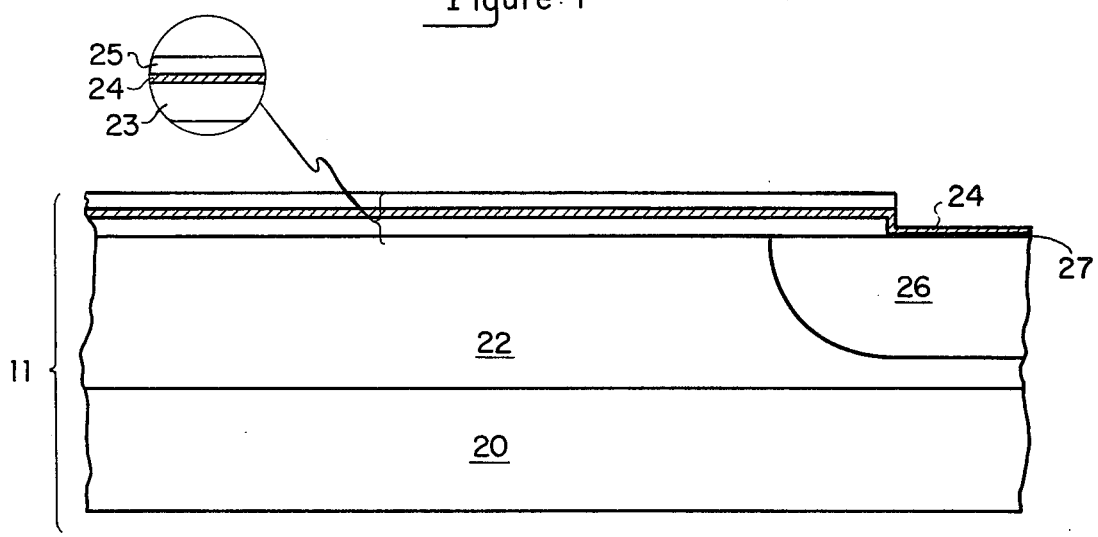
FIG. 2 is a cross-sectional view of a Schottky barrier diode chip used in several embodiments of the present invention.

Referring to FIG. 2 a Schottky barrier diode chip is first formed of $n^+$ substrate 20 on which contiguous regions 22, 23, 24 and 25 are deposited. P-type guard ring 26 is formed in N-type epitaxial layer 22. A buffer layer 27 of silicon dioxide ($SiO_2$) is provided between P-type guard ring 26 and region 24. Regions 23 and 25 also comprise $SiO_2$. Region 24 is formed of silicon nitride ($Si_3N_4$) and will be discussed later in this specification. This configuration of the active semiconductor Region 37 (FIG. 3) of the diode chip is unaffected by the packaging configurations of the present invention.

Figure 3:
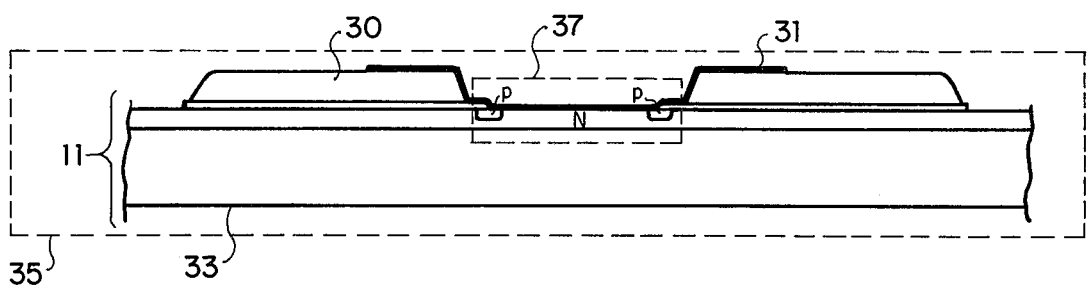
FIG. 3 is a cross-sectional view of a Schottky barrier diode chip constructed according to one embodiment of the present invention.

After the diode chip is formed as shown in FIG. 2, it is ready for modification in accordance with the principles of the present invention. As shown in FIG. 3, one embodiment includes a layer of glass 30 deposited over the entire surface of chip 11 except in the immediate area of the active Schottky barrier region 37. Metallization 31 for electrical contact to the anode of the diode is then applied over the entire barrier region 37, continuing over the top of the glass layer.

Figure 1:
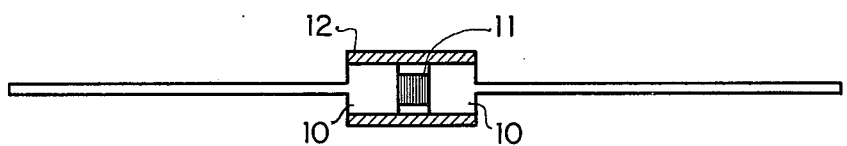
FIG. 1 is a simplified cross-sectional view of an assembled DO-35 semiconductor package.

Metallization 31 is a deposition of tungsten (W) followed by a deposition of silver (Ag). Ag is used for reliable electrical contact with a stud 10. Tungsten is used to control the Schottky barrier height and protect against metallurgical reaction of Ag with the semiconductor chip at the package sealing temperature. In the packaged configuration of the present invention, surface 33 of modified chip 35 is placed on one stud, now referred to as the cathode stud. After glass sleeve 12 is in place around the cathode stud, the anode stud is inserted to make contact with metallization 31. Thus, modified diode chip 35 is sandwiched between two studs 10 as shown in FIG. 1, the physical contact of studs 10 being effective for making electrical contact with the anode and cathode of diode chip 35. The entire assembly is then heated to the required temperature for hermetic seal of glass sleeve 12 to studs 10. As sleeve 12 cools it contracts, hence increasing the pressure which studs 10 apply to chip 35. However that increased pressure is transmitted via glass layer 30 to the chip a substantial distance away from active barrier region 37, yet electrical contact with the anode portion of diode chip 35 is maintained via metallization 31.

Of course other combinations of metallization material can be used so long as the objectives of controlling barrier height, contacting the studs and withstanding high temperature sealing of the package are achieved. For example, instead of a W-Ag metallization, the metallization could comprise W-Ti-Ag W-Cr-Au or W-Cr-Ag.

Figure 4A:
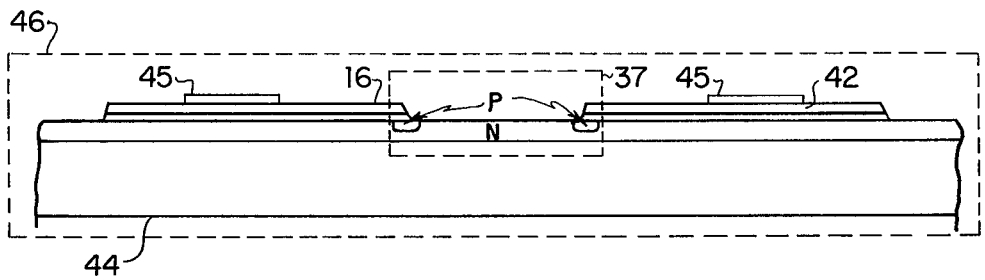
FIG. 4a is a cross-sectional view of a Scottky barrier diode chip constructed according to another embodiment of the present invention.
Figure 4B:
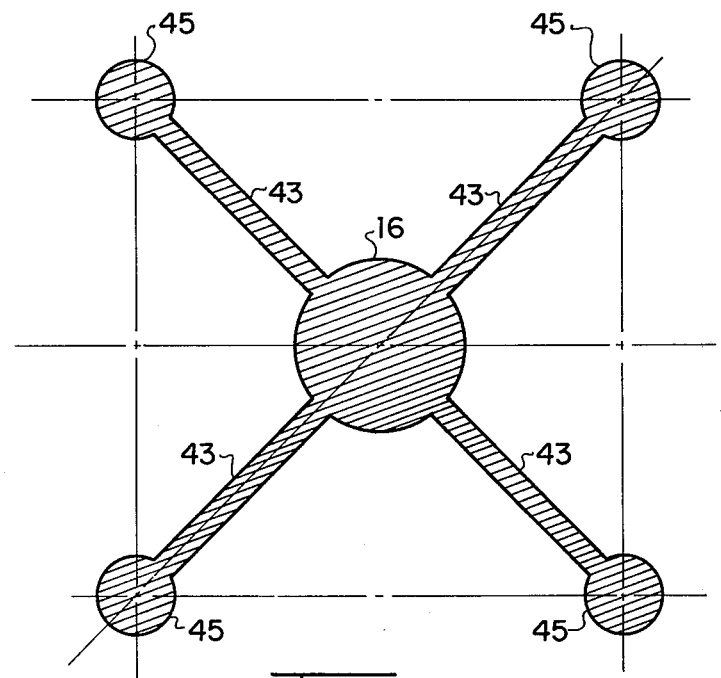

Referring now to FIGS. 4a and 4b, another embodiment of diode chip 35 constructed according to the principles of the present invention is shown. Construction of the diode is similar to that shown in and described for FIG. 1 but wihtout glass layer 30. Prior to metallization a relatively thick layer 42 of $SiO_2$ is deposited over the entire surface of chip 11 with the exception of barrier region 37. The commercially available "ROTOX" process is used for the deposition. Thereafter, metallization 16, which includes a layer of W, is deposited, substantially covering the barrier region but having fingers 43 leading to coplanar electrical contact pads 45 remotely disposed at a relatively substantial distance from barrier region 37. The contact pads 45 comprise a deposition of titanium (Ti) followed by a layer of Ag and are built up by electroplating additional Ag to a thickness significantly greater than metal fingers 43. For assembly, as with the configuration of FIG. 3, surface 44 of modified chip 46 is placed on one stud and, after the glass sleeve 12 is in place, the second stud is inserted to make electrical contact with one or more of the four electrical contact pads 45. This chip configuration has fewer process steps to build than the configuration of FIG. 1.

Figure 5:
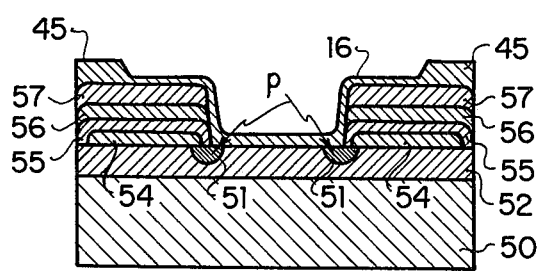
FIG. 5 is a cross-sectional view of a Schottky barrier diode chip constructed according to another embodiment of the present invention.

Referring to FIG. 5, a layer 57 of $Si_3N_4$ is added to a chip similar to the chip shown in FIGS. 4a and 4b prior to applying metallization 16 to form another configuration of the present invention. The chip comprises substrate 50 on which a contiguous N-type expitaxial layer 52 is grown and in which P-type guard rings 51 are formed. Layers 54 and 56 are $SiO_2$ and layers 55 and 57 are $Si_3N_4$. Metallization 16 leading to homogeneous contact pads is then applied over the active region (analogous to active region 37 shown in FIG. 3) and layer 57. Alternatively, layer 57 may be formed of $SiO_2$ highly doped with either phosphorous or boron, or of any other dielectric material which provides an ionic barrier against impurities formed during high temperature sealing of the package.

One source of chemical impurities during the high temperature sealing process is sodium tetraborate which is used as a flux. The passivation of $Si_3N_4$ over the entire surface of chip 11 acts as a barrier to such impurities which would otherwise cause degradation of performance of the devices with time. This passivation layer is represented as region 24 in FIG. 2 and regions 55 and 57 in FIG. 5.

While described for use with the Schottky barrier diode chip, the configuration of the present invention is useful with any semiconductor chip, particularly those which are sensitive to temperatures and pressures developed while being enclosed and sealed in the DO-35 package.

I claim:
1. A configuration of semiconductor chip having at least one active region for use in a high-temperature seal, pressure-contact lead package, said semiconductor chip configuration comprising:
a semiconductor chip;
a layer of a first material covering the entire semiconductor chip, except at least a portion of the active region thereof, for chemically insulating the semiconductor chip;
a layer of a second material covering the first layer of the first material for chemically insulating the semiconductor chip from reacting with the package impurities;
a layer of the first material covering the layer of the second material for enhancing adhesion thereof with other materials;
a layer of a third material covering the last-mentioned layer of the first material for providing insulation and reducing semiconductor chip capacitance; and
a layer of electrically conducting material covering the entire active region of the semiconductor chip and covering a portion of the layer of third material for physically and electrically contacting a lead,
said portion of conducting material over the third material having a pad portion disposed so as to contact said lead at a relatively substantial distance from the active region, thereby to transmit pressure of the contacting lead away from the active region.

2. A semiconductor chip configuration as in claim 1 wherein:
the first material is silicon dioxide;
the second material is silicon nitride;
the third material is glass; and
the layer of conducting material includes a first layer of tungsten and a second layer of silver.

3. A semiconductor chip configuration as in claim 1 wherein the thickness of the layer of conducting materials is substantially uniform over its entire area.

4. A semiconductor chip configuration as in claim 1 wherein the layer of conducting material includes at least one narrow extension thereof connecting to at least one contact pad portion, the thickness of said contact pad portion being greater than the thickness of the remaining portion of the layer of the conducting material.

5. A semiconductor chip configuration as in claim 4 wherein the layer of conducting material includes four narrow extensions thereof each connecting to one contact pad.

6. A semiconductor chip configuration as in claim 4 wherein:
the first and third material is silicon dioxide;
the second material is silicon nitride; and
the layer of conducting material includes a first layer of tungsten, a second layer of titanium and a third layer of silver.

7. A semiconductor chip configuration as in claim 4 wherein the third material is the same material as the second material.

* * * * *